US008623478B2

(12) United States Patent
Koutake et al.

(10) Patent No.: US 8,623,478 B2
(45) Date of Patent: Jan. 7, 2014

(54) ORGANIC SEMICONDUCTOR INK COMPOSITION AND METHOD FOR FORMING ORGANIC SEMICONDUCTOR PATTERN USING THE SAME

(75) Inventors: Masayoshi Koutake, Tokyo (JP); Masanori Kasai, Tokyo (JP); Hisatomo Yonehara, Tokyo (JP); Kiyofumi Takano, Chiba (JP)

(73) Assignee: DIC Corporation, Tokyo (JP)

( * ) Notice: Subject to any disclaimer, the term of this patent is extended or adjusted under 35 U.S.C. 154(b) by 10 days.

(21) Appl. No.: 13/262,310

(22) PCT Filed: Mar. 30, 2010

(86) PCT No.: PCT/JP2010/055661
§ 371 (c)(1),
(2), (4) Date: Dec. 19, 2011

(87) PCT Pub. No.: WO2010/113931
PCT Pub. Date: Oct. 7, 2010

(65) Prior Publication Data
US 2012/0100667 A1   Apr. 26, 2012

(30) Foreign Application Priority Data
Mar. 31, 2009   (JP) ................................. 2009-085501

(51) Int. Cl.
*B41M 5/00* (2006.01)
(52) U.S. Cl.
USPC .......................................... 428/32.1; 523/160
(58) Field of Classification Search
USPC .............. 438/48, 99, 149; 428/32.1; 523/160
See application file for complete search history.

(56) References Cited

U.S. PATENT DOCUMENTS 6,545,291 B1   4/2003   Amundson et al.
6,661,024 B1   12/2003   Zhang et al.
(Continued)

FOREIGN PATENT DOCUMENTS

JP   2003-508807 A   3/2003
JP   2004-535653 A   11/2004
(Continued)

OTHER PUBLICATIONS

C. D. Dimitrakopoulos, et al., Organic Thin Film Transistors for Large Area Electronics, Advanced Materials, vol. 14, No. 2, Jan. 16, 2002, pp. 99-117.
J. Veres, et al., Gate Insulators in Organic Field-Effect Transistors, Chem. Mater., vol. 16, No. 23, 2004, pp. 4543-4555.

*Primary Examiner* — Brook Kebede
(74) *Attorney, Agent, or Firm* — McDermott Will & Emery LLP

(57) ABSTRACT

Provided is an ink that is the most suitable for a method for forming an organic transistor by transferring a pattern using a liquid-repellent transfer substrate, for example, a microcontact printing method or a reverse printing method. Specifically, provided is an organic semiconductor ink composition which can provide a uniform ink coating film on a surface of a liquid-repellent transfer substrate and which can provide a dry ink film or a semi-dry ink film capable of being easily transferred from the transfer substrate to a transfer-receiving base material. Also provided is a method for forming an organic semiconductor pattern of an organic transistor, the method using the organic semiconductor ink composition. The organic semiconductor ink composition used for obtaining a desired pattern by transferring an ink layer formed on a liquid-repellent transfer substrate to a printing base material contains an organic semiconductor, an organic solvent, and a fluorine-based surfactant.

6 Claims, 1 Drawing Sheet

(56) References Cited

U.S. PATENT DOCUMENTS

| | | |
|---|---|---|
| 2003/0141500 A1 | 7/2003 | Amundson et al. |
| 2003/0211649 A1* | 11/2003 | Hirai et al. .................. 438/48 |
| 2004/0225056 A1 | 11/2004 | Spreitzer et al. |
| 2006/0014365 A1 | 1/2006 | Kugler et al. |
| 2006/0127592 A1 | 6/2006 | Spreitzer et al. |
| 2007/0148812 A1* | 6/2007 | Wu et al. .................. 438/99 |

FOREIGN PATENT DOCUMENTS

| | | |
|---|---|---|
| JP | 2005-126608 A | 5/2005 |
| JP | 2005-532690 A | 10/2005 |
| JP | 2006-41495 A | 2/2006 |
| JP | 2007-67390 A | 3/2007 |
| JP | 2007-184437 A | 7/2007 |
| JP | 2007-254635 A | 10/2007 |

* cited by examiner

ORGANIC SEMICONDUCTOR INK COMPOSITION AND METHOD FOR FORMING ORGANIC SEMICONDUCTOR PATTERN USING THE SAME

CROSS REFERENCE TO PRIOR APPLICATIONS

This application is a U.S. National Phase application under 35 U.S.C. §371 of International Application No. PCT/JP2010/055661, filed on Mar. 30, 2010 and claims benefit of priority to Japanese Patent Application No. 2009-085501, filed on Mar. 31, 2009. The International Application was published in Japanese on Oct. 7, 2010 as WO 2010/113931 A1 under PCT Article 21(2). The contents of these applications are hereby incorporated by reference.

TECHNICAL FIELD

The present invention relates to an organic semiconductor ink composition used for forming an organic semiconductor pattern, and a method for forming an organic semiconductor pattern.

BACKGROUND

Recently, organic transistor elements, in which an organic semiconductor has been applied, have attracted attention (refer to Advanced Materials, 2002, Vol. 14, p. 99). Such organic transistor elements can be formed by a wet process such as a printing method, and thus the production cost can be significantly reduced as compared with existing silicon processes, which require expensive production facilities. In addition, since the process can be performed at low temperatures, the organic transistor elements can be formed even on a plastic substrate. Thus, organic transistor elements have been actively studied as a technology for realizing flexible thin-film transistor (TFT) elements. As application examples of organic TFTs, examination of electronic paper, displays, radio-frequency identification (RFID), and various sensors has been conducted toward realization of practical use.

An organic transistor is an organic semiconductor element including, as essential components, three constituents, namely, an electrode layer, an insulating layer, and a semiconductor layer. Methods for forming the electrode layer, the insulating layer, and the semiconductor layer that constitute the element are divided into a wet process such as a printing method and a dry process such as vacuum deposition or sputtering. From the standpoint of productivity and a reduction in the cost, the wet process is overwhelmingly advantageous (refer to Chemistry of Materials, 2004, Vol. 16, p. 4543).

In the formation of transistor circuits, patterning of an organic semiconductor is important. It is necessary to form a semiconductor layer in a desired region of the transistor circuits, for example, in the case of a lateral TFT element, it is necessary to form a semiconductor layer so that the semiconductor layer extends over each source electrode and a corresponding drain electrode, and so that the semiconductor layer is electrically isolated from adjacent element portions. This structure can suppress interference between adjacent elements due to a leakage current, and thus it is possible to reduce an off-state current of a transistor and to accurately control the circuits.

As a method for forming an organic semiconductor layer by a wet process, a spin-coating method and a dip-coating method are most generally employed. However, in these methods, the organic semiconductor layer is formed as a solid film that entirely covers a plurality of device regions. It is difficult to form a desired organic semiconductor pattern only in a necessary region using these methods. An ink jet method has been studied as a method for forming an organic semiconductor layer at a desired position on transistor circuits. However, it is difficult to form a pattern having a size of 50 μm or less using the ink jet method, and thus the pattern fineness is limited. In addition, it is difficult to form a desired shape. Furthermore, the printing speed is low, and thus there is a problem in terms of productivity.

In order to solve these problems, recently, various pattern transfer methods using a liquid-repellent transfer plate have been studied. For example, Japanese Unexamined Patent Application Publication No. 2007-67390 ("JP '390") and Japanese Unexamined Patent Application Publication No. 2007-184437 ("JP '437") disclose a method for producing a semiconductor device (element) and an apparatus for producing a semiconductor device (element) characterized in that an organic semiconductor crystal layer is formed on a water-repellent surface of a stamp substrate having water repellency, and the stamp plate is pressed on a transfer-receiving substrate on which source and drain electrodes have been formed in advance to transfer the semiconductor layer. However, neither JP '390 nor JP '437 discloses a composition of a semiconductor ink used in the printing method using such a transfer plate (stamp substrate) except that an organic semiconductor is simply dissolved in an organic solvent, and the resulting solution is provided as the ink. Even when a solution prepared by dissolving an organic semiconductor is merely used, it is difficult to form a precise and fine pattern on the stamp substrate without defects, and furthermore, it is difficult to completely transfer the pattern to the transfer-receiving substrate. A large number of pattern defects are generated, and thus such a solution cannot be used in practical applications. A special organic semiconductor ink that is the most suitable for the above printing method has been desired.

The following printing properties are required for an organic semiconductor ink for transfer, the ink being used for obtaining a desired pattern by a method, such as a reverse printing method or a microcontact printing method, in which an ink layer is formed on a liquid-repellent transfer substrate, patterning of the ink is performed as required, and the ink layer is then transferred to a printing base material, for example: (1) A uniform ink coating film can be formed on a surface of a liquid-repellent transfer substrate. (2) A dry ink film or a semi-dry ink film is easily transferred from the transfer substrate to a transfer-receiving base material on which an organic transistor is to be formed. Furthermore, in the case where the reverse printing method is applied, (3) an accurate pattern can be formed using a removal plate from an ink solid coating film formed on the transfer substrate. In addition to these printing properties, the organic semiconductor ink requires that a formed organic semiconductor thin film have excellent transistor characteristics.

SUMMARY

A first object of the present invention is to provide an organic semiconductor ink composition that satisfies these required properties and that is the most suitable for use in a method for forming an organic transistor, such as a microcontact printing method or a reverse printing method, the method including transferring a pattern using a liquid-repellent transfer substrate. A second object of the present invention is to provide a method for forming an organic semiconductor pattern of an organic transistor using the organic semiconductor ink composition.

First, the present invention provides an organic semiconductor ink composition used for obtaining a desired pattern by transferring an ink provided on a liquid-repellent transfer substrate to a printing base material, the organic semiconductor ink composition containing an organic semiconductor, an organic solvent, and a fluorine-based surfactant.

Secondly, the present invention provides a method for forming an organic semiconductor pattern of an organic transistor, the method including a step of forming an organic semiconductor pattern layer by a microcontact printing method and/or a reverse printing method using the above organic semiconductor ink composition.

By using the organic semiconductor ink composition of the present invention, a precise, fine, and position-selective organic semiconductor pattern having a desired shape can be formed and an organic transistor having excellent electrical characteristics can be produced by a printing method, such as a microcontact printing method or a reverse printing method, used for obtaining a pattern by forming an ink coating film on a liquid-repellent transfer substrate, patterning the ink as required, and then transferring the ink coating film onto a printing base material. For example, in producing an organic TFT, by forming an organic semiconductor pattern in only desired regions of circuits, a leakage current and crosstalk can be suppressed, the ON/OFF ratio of the element can be significantly increased, and circuit control with few malfunctions can be realized. In addition, by using the organic semiconductor ink composition of the present invention, a precise pattern of organic semiconductors having different characteristics can be easily formed on different regions on a device or different devices in a circuit. Thus, logic circuits such as an inverter, a memory, a transmitter, and the like can be easily formed by printing by using semiconductors having different characteristics, such as a P-type semiconductor and an N-type semiconductor, in combination.

DETAILED DESCRIPTION

Figure 1:
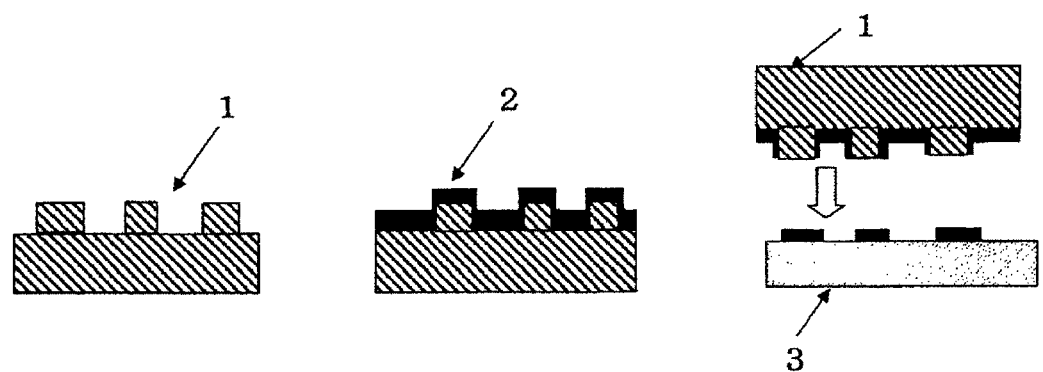
FIG. 1 illustrates steps of a microcontact printing method.

Examples of the present invention will now be described. An organic semiconductor ink composition of the present invention is an organic semiconductor ink composition for transfer, the ink being used for obtaining a desired pattern by forming an ink layer on a liquid-repellent transfer substrate, patterning the ink as required, and then transferring the ink layer onto a printing base material, and is an ink composition for forming an organic semiconductor pattern, the ink composition containing an organic semiconductor, an organic solvent, and a fluorine-based surfactant.

The transfer substrate used for forming a layer composed of the organic semiconductor ink composition of the present invention is not limited as long as a surface to be subjected to inking is liquid-repellent. A base material itself constituting the substrate may be composed of a liquid-repellent material. Alternatively, liquid repellency may be imparted to a base material by performing a surface treatment or forming a composite material with a liquid-repellent material. Among these substrates, the liquid-repellent transfer substrate preferably has a surface having a critical surface tension of 16 to 35 mN/m. When the critical surface tension is less than 16 mN/m, the repellency of the ink is strong, and it becomes difficult to evenly apply the ink. When the critical surface tension exceeds 35 mN/m, it becomes difficult to transfer the ink from the transfer substrate to a surface of a base material.

The shape of the transfer substrate is not particularly limited, and the transfer substrate may have a roll shape or a flat plate shape. For example, a silicone-based resin or rubber, or a fluorine-based resin or rubber is preferably used as the transfer substrate. Alternatively, for example, it is possible to use a substrate prepared by treating with a release agent or providing a releasing layer on a surface of an appropriate base material such as a rubber, a resin, a ceramic, or a metal. Examples of the release agent that can be used include silicone-based release agents, fluorine-based release agents, mineral oil release agents, fatty acid release agents, and metal soap release agents. Examples of the releasing layer that can be used include coating layers composed of a silicone-based resin, a fluorine-based resin, a polyolefin resin, or the like; and layers composed of a metal composite oxide or ceramic containing nickel, titanium, or the like, the layers being formed by plating, vapor deposition, plasma, baking, or the like.

Among these, silicone-based rubbers (silicone rubbers), fluorine-based rubbers (fluorine rubbers), and rubbers composed of a copolymer thereof can be suitably used as the material forming the liquid-repellent surface for transfer from the standpoint that these materials have an excellent ink pattern-forming property and an excellent transfer property, and are excellent in terms of solvent resistance. The surface energy of any of these rubbers may be adjusted by an UV-ozone treatment or the like, as required, as long as the critical surface tension does not exceed 35 mN/m.

Example of the method used for obtaining a desired pattern by performing inking on a liquid-repellent transfer substrate, patterning the ink as required, and then transferring the ink onto a printing base material include a microcontact printing method and a reverse printing method. A typical microcontact printing method is a printing method in which a silicone rubber plate functioning as a liquid-repellent transfer substrate is used as a stamp. FIG. 1 illustrates a model of steps of the microcontact printing method. It is a first example of the application of the microcontact printing method that, successfully, a monomolecular film serving as a mask and having a thickness of 1 nm was formed by printing, and a fine pattern was then formed by etching, a hydrophilizing treatment, or a hydrophobizing treatment. Recently, the microcontact printing method has been actively studied as a technique with which, for example, a precise conductive pattern forming a precise electric/electronic device typified by an organic transistor can be formed directly by printing with an accuracy and resolution of several micrometers.

Figure 2:
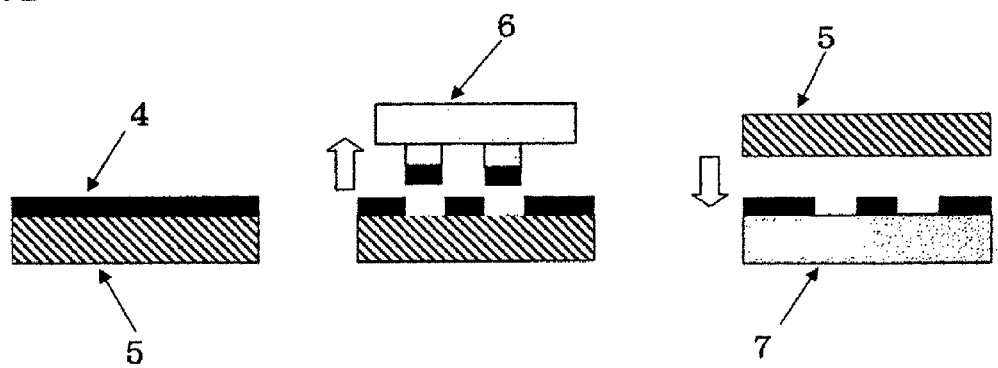
FIG. 2 illustrates steps of a relief reverse printing method.

The reverse printing method is a printing method in which an ink is applied onto a blanket to form a solid ink-applied surface, a relief plate having a negative pattern and composed of glass, a resin, or the like is pressed on the ink-applied surface to remove a portion of the ink, which is in contact with the relief plate, from the blanket, and the ink remaining on the blanket is then transferred to a printing object. FIG. 2 illustrates a model of steps of reverse printing. The reverse printing method has been actively studied as a method for producing a color filter or producing an organic EL and an organic transistor, the method being alternative to a photolithographic method.

As the organic semiconductor material used in the organic semiconductor ink composition of the present invention, a solvent-soluble high-molecular and/or low-molecular organic semiconductor can be used. Examples of the solvent-soluble high-molecular organic semiconductor include fluorene polymers such as F8T2, phenylene vinylene polymers, triarylamine polymers, and polythiophene polymers such as P3HT (poly(3-hexylthiophene)), PQT-12 (poly[5,5'-bis(3-dodecyl-2-thienyl 1)-2,2'-bithiophene]), and PBTTTs (poly (2,5-bis(3-alkylthiophen-2-yl)thieno[3,2-b]thiophene)). These polymers can be suitably used alone or as a mixture of two or more polymers.

Examples of the soluble low-molecular organic semiconductor that can be suitably used include thiophene fused ring and/or thiophene polycyclic compounds such as dioctyl quarter thiophene and benzothieno benzothiophene thiophene, in which an alkyl group is introduced into the molecule for solubilization, pentacene precursors, soluble pentacenes such as TIPS pentacene, solubilized fullerene compounds, and precursors and mixtures of these organic semiconductors. These high-molecular organic semiconductors and the low-molecular semiconductors can be used alone or as a mixture of two or more semiconductors.

The present invention provides an example of an organic semiconductor ink composition in which the organic semiconductor is in a dispersion system. Herein, the term "dispersion system" refers to a state in which at least one organic semiconductor is present in an ink in a crystal particle and/or colloidal dispersion state. Of course, a part of the organic semiconductor may be present in a dissolved state in the dispersion system. By using the organic semiconductor present in a solvent dispersion system, the printing properties of the ink can be improved, and electrical characteristics of a transistor formed can be improved. For example, in the case where the organic semiconductor ink composition of the present invention is applied to reverse printing, a uniform ink coating film can be easily formed on a highly liquid-repellent silicone rubber or fluorine rubber functioning as a transfer substrate. In addition, a draining property of the ink can also be improved. For example, in the case where the organic semiconductor ink composition is applied to the reverse printing method, a precise pattern can be easily formed using a removal plate composed of glass or the like and having a negative pattern thereon.

This dispersion system can be prepared as follows. For example, in the case where P3HT is used as the organic semiconductor, a good solvent such as tetrahydrofuran (THF), chloroform, or ortho-dichlorobenzene and a solvent in which the organic semiconductor has a slightly poor solubility, such as mesitylene, anisole, or tetrafluoromethylbenzene are mixed in an appropriate ratio, and P3HT is dissolved in the mixed solvent by heating, and the solution is then slowly cooled to prepare a gel. The gel is broken by vibration or the like. If necessary, the broken gel is diluted with an appropriate solvent that does not dissolve the gel and does not cause coagulation/precipitation of the P3HT gel at room temperature, for example, xylene, mesitylene, tetralin, anisol, chlorobenzene, ortho-dichlorobenzene, trifluoromethyl benzene, dichlorobenzotrifluoride, or trifluoromethyl chlorobenzene. Regarding the solvent composition forming a dispersion system ink of the organic semiconductor, an optimal system should be appropriately selected in accordance with the solubility of the organic semiconductor used.

In the case where a crystalline organic semiconductor oligomer or a low-molecular crystalline organic semiconductor such as TIPS pentacene is used as the organic semiconductor, the dispersion system can be prepared as follows. The crystalline organic semiconductor is dissolved in a good solvent such as chloroform or xylene by heating, and the solution is then slowly cooled. If necessary, a poor solvent such as an alcohol, a ketone, or a glycol ether is added thereto, thereby forming crystal particles in the solution. The crystal particles are separated as required, and are redispersed in a solvent, such as an alcohol, which does not redissolve the crystal particles.

Among the above organic semiconductors, polythiophene polymer compounds can be suitably used. For example, P3HT (poly(3-hexylthiophene)), PQT-12 (poly[5,5'-bis(3-dodecyl-2-thienyl 1)-2,2'-bithiophene]), and thiophene-thienothiophene copolymers (PBTTTs) such as PB10TTT, PB12TTT, PB14TTT, and PB16PBTTT can be suitably used alone or as a mixture of two or more compounds. These organic semiconductors have a high self-assembling property and form a crystal structure, thereby exhibiting excellent transistor characteristics. In addition, in the case where an array is formed, it is easy to suppress the variation in the transistor characteristics among elements. When these organic semiconductors are used, not only an organic semiconductor ink composition having excellent printing properties can be formed by adding a fluorine-based surfactant, but also the transistor characteristics thereof can be improved.

The organic semiconductor ink composition of the present invention is characterized by containing a solvent that disperses and/or dissolves an organic semiconductor. Any solvent can be used as long as the solvent has a moderate volatility, and an organic semiconductor thin film can be formed after the solvent is volatilized at room temperature or by heating. Examples of the solvent having a relatively high solubility for organic semiconductors include aromatic hydrocarbons such as toluene, xylene, mesitylene, anisole, chlorobenzene, dichlorobenzene, trichlorobenzene, trifluoromethyl benzene, dichlorobenzotrifluoride, and trifluoromethyl chlorobenzene; derivatives thereof such as chlorine substitution products and fluorine substitution products; naphthalene derivatives such as tetralin and decalin; chlorinated aliphatic hydrocarbons such as chloroform, carbon tetrachloride, dichloromethane, and tetrachloroethylene; and cyclic ether compounds such as tetrahydrofuran, tetrahydropyran, and oxetane. These solvents can be suitably used alone or as a mixed solvent containing two or more of these solvents.

In addition to the above solvents, the following solvents can be applied to a solvent for dispersing microcrystals of organic semiconductors. Examples thereof include water; alcohols such as methanol, ethanol, isopropyl alcohol, and isobutyl alcohol; esters such as methyl acetate, ethyl acetate, propyl acetate, isopropyl acetate, and butyl acetate; ethers such as ethyl ether and dioxane; ketones such as acetone, methyl ethyl ketone, and methyl butyl ethyl ketone; glycol ethers such as propylene glycol monomethyl ether, propylene glycol monomethyl ether acetate, ethylene glycol monoethyl ether, ethylene glycol monoethyl ether acetate, ethylene glycol monobutyl ether, ethylene glycol monomethyl ether, diethylene glycol monomethyl ether, and diethylene glycol monomethyl ether acetate; alicyclic hydrocarbons such as cyclohexane, methylcyclohexanone, and cyclohexanol; and aliphatic hydrocarbons such as n-hexane and heptane.

The solvent used in the organic semiconductor ink composition of the present invention is preferably a mixed organic solvent containing at least one solvent having a boiling point of 100° C. or lower and at least one solvent having a boiling point of 150° C. or higher. In the mixed solvent system, the surface tension of a mixed organic solvent is preferably 35 mN/m or less, and more preferably 25 mN/m or less. By using a solvent having a boiling point of 100° C. or lower, when an organic semiconductor ink coating film is formed on a transfer plate, the ink has a satisfactory fluidity and a uniform thin film can be easily formed. Subsequently, while the ink is transferred from the transfer plate to a final base material, most of the solvent is vaporized in the air or absorbed in the transfer plate, thereby increasing the viscosity of the coating film of the organic semiconductor ink composition and imparting an appropriate adhesiveness to the transfer on the base material. The amount of this solvent mixed is appropriately adjusted in accordance with the type of organic semiconductor used, the printing speed of a transfer printing method, the printing environment, and the like. However, preferably, the amount of this solvent is appropriately adjusted to be in the range of 10% to 90% of the total amount of the solvents of the organic semiconductor ink composition. Preferable examples of the quick-drying solvent having solubility to organic semiconductors include hydrocarbon solvents such as cyclohexane; halogenated hydrocarbon solvents such as methylene chloride, tetrachloroethylene, chloroform, carbon tetrachloride, dichloroethane, and trichloroethane; and cyclic ethers such as tetrahydrofuran, oxetane, and tetrahydropyran. In addition, examples of the solvent that can disperse organic semiconductor microcrystals include alcohols such as methanol, ethanol, and propanol; esters such as methyl acetate, ethyl acetate, and isopropyl acetate; ketones such as acetone and methyl ethyl ketone; and aliphatic hydrocarbons such as n-hexane. These solvents may be used alone or as a mixed solvent of two or more solvents.

In the case where a solvent having a boiling point of 150° C. or higher is used as a slow-drying solvent, the slow-drying solvent remains in an ink coating film to some extent, while an organic semiconductor ink composition coating film on a transfer plate is finally transferred to a printing base material. Thus, it is possible to prevent the ink from completely drying and to maintain adhesiveness and cohesiveness necessary for the transfer. The amount of this solvent mixed is appropriately adjusted in accordance with the type of organic semiconductor used, the printing speed of a transfer printing method, the printing environment, and the like. However, preferably, the amount of this solvent is appropriately adjusted to be in the range of 10% to 90% of the total amount of the solvents of the ink. Preferable examples of the slow-drying solvent having a certain degree of solubility to organic semiconductors include naphthalene derivatives such as tetralin and decalin; aromatic hydrocarbons such as mesitylene, anisol, chlorobenzene, dichlorobenzene, trichlorobenzene, trifluoromethyl benzene, dichlorobenzotrifluoride, and trifluoromethyl chlorobenzene; and derivatives thereof.

In addition to the above solvents, the following solvents can be suitably applied to a solvent for dispersing microcrystals of organic semiconductors. Examples thereof include water; alcohols such as butanediol and octanol; esters such as butyl acetate and methoxy butyl acetate; ethers such as butyl cellosolve; ketones such as diacetone alcohol, cyclohexanone, methylcyclohexanone, and diisobutyl ketone; glycol ethers such as ethylene glycol monoethyl ether, ethylene glycol monoethyl ether acetate, ethylene glycol monobutyl ether, ethylene glycol monomethyl ether, diethylene glycol monomethyl ether, and diethylene glycol monomethyl ether acetate; alicyclic hydrocarbons such as cyclohexane, methylcyclohexanone, and cyclohexanol; and aliphatic hydrocarbons such as n-hexane and heptane.

The surface tension of the organic semiconductor ink composition of the present invention is preferably 35 mN/m or less, and more preferably 25 mN/m or less. The surface tension of the ink can be adjusted by changing the combination of the solvent system and/or adding a fluorine-based surfactant.

The organic semiconductor ink composition forming an organic semiconductor layer in an organic transistor can contain a fluorine-based surfactant. By adding the fluorine-based surfactant to the ink, it is possible to improve printing properties necessary for the ink, for example, a property of forming a uniform ink thin film for which repellency on a liquid-repellent surface functioning as a transfer plate for printing does not occur, a property of forming a fine semiconductor pattern on a transfer plate, and a property of transferring the fine pattern from the transfer plate to a substrate without impairing electrical characteristics of an organic semiconductor.

A surfactant having a fluorine-containing group, a hydrophilic group and/or a lipophilic group in the same molecule thereof can be used as the fluorine-based surfactant. Herein, the fluorine-containing group is not particularly limited, but is preferably a perfluoroalkyl group in which all or some of hydrogen atoms of an alkyl group are replaced with fluorine atoms, or a perfluoropolyether group having a structure in which perfluoroalkyl groups are bonded to each other through an oxygen atom. In the case where the fluorine-containing group is a perfluoroalkyl group, the number of carbons thereof is preferably 6 or more.

According to knowledge of the inventors of the present invention, from the standpoint of a control of the electron field-effect mobility and an improvement in transistor characteristics such as the ON/OFF ratio, the fluorine-based surfactant is preferably a fluorinated (meth)acrylic polymer. In the fluorinated (meth)acrylic polymer, the fluorine-containing group may be present in any of the main chain, a side chain, and a molecular terminal. However, from the standpoint of the control of the fluorine content in the polymer, availability of the raw material, etc., the fluorine-containing group is preferably present in a side chain, and the polymer is preferably obtained by using a fluorinated (meth)acrylate as a raw material because this method is industrially simple.

Hereinafter, unless otherwise stated, methacrylates, acrylates, haloacrylates, and cyanoacrylates are collectively referred to as "(meth)acrylates". Fluorinated (meth)acrylates are represented by, for example, general formula (AG-1) below.

$$CH_2=C(R_1)COO(X)_aC_mF_{2m+1} \quad \text{(General formula AG-1)}$$

Here, $R_1$ is H, $CH_3$, Cl, F, or CN, X is a divalent linking group, specifically, $-(CH_2)_n-$, $-CH_2CH(OH)(CH_2)_n-$, $-(CH_2)_nN(R_2)SO_2-$, $-(CH_2)_nN(R_2)CO-$ (where n is an integer of 1 to 10, and $R_2$ is H or an alkyl group having 1 to 18 carbon atoms), $-CH(CH_3)-$, $-CH(CH_2CH_3)-$, $-C(CH_3)_2-$, $-CH(CF_3)-$, $-C(CF_3)_2-$, $-CH_2CFH-$, or the like, a is 0 or 1, and m is an integer of 1 to 20.

Specific examples of the fluorinated (meth)acrylate include the following:
A-1: $CH_2=CHCOOCH_2CH_2C_8F_{17}$
A-2: $CH_2=C(CH_3)COOCH_2CH_2C_8F_{17}$
A-3: $CH_2=CHCOOCH_2CH_2Cl_2F_{25}$
A-4: $CH_2=CHCOOCH_2CH_2C_6F_{13}$
A-5: $CH_2=CHCOOCH_2CH_2C_4F_9$
A-6: $CH_2=CFCOOCH_2CH_2C_6F_{13}$
A-7: $CH_2=CHCOOCH_2CF_3$
A-8: $CH_2=C(CH_3)COOCH_2CF(CF_3)_2$
A-9: $CH_2=C(CH_3)COOCH_2CFHCF_3$
A-10: $CH_2=CHCOOCH_2(CF_2)_6H$
A-11: $CH_2=CHCOOCH_2CH(OH)CH_2C_8F_{17}$
A-12: $CH_2=CHCOOCH_2CH_2N(C_3H_7)SO_2C_8F_{17}$
A-13: $CH_2=CHCOOCH_2CH_2N(C_2H_5)COC_7F_{15}$ Alternatively, a compound having a plurality of fluorine-containing groups in the same molecule, the compound being represented by general formula (AG-2) below may also be used as the fluorinated (meth)acrylate.

[Chem. 1]

(General Formula AG-2)

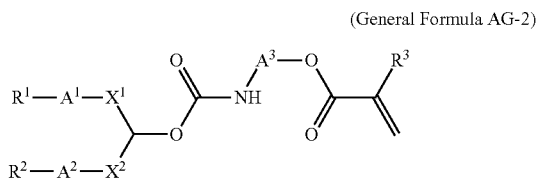

($R^1$ and $R^2$ in general formula (AG-2) each independently represent a perfluoroalkyl group having 1 to 20 carbon atoms or a perfluoroalkyl group which has a total number of carbon atoms of 1 to 20 and in which perfluoroalkyl groups are linked to each other through an oxygen atom, $R^3$ represents a hydrogen atom or a methyl group, $A^1$ and $A^2$ each independently represent an alkylene group having 1 to 3 carbon atoms or a direct bond, $A^3$ represents an alkylene group having 2 to 3 carbon atoms, $X^1$ and $X^2$ each independently represent an oxygen atom, a sulfur atom, or a sulfonamide.)

The fluorine compound represented by general formula (AG-2) is obtained by, for example, allowing a fluorine compound having a hydroxyl group and represented by general formula (B) below to react with a compound having an isocyanate group and a (meth)acryloyl group.

[Chem. 2]

(B)

($R^1$ and $R^2$ in general formula (B) each independently represent a perfluoroalkyl group having 8 carbon atoms or a perfluoroalkyl group which has a total number of carbon atoms of 1 to 20 and in which perfluoroalkyl groups are linked to each other through an oxygen atom, $A^1$ and $A^2$ each independently represent an alkylene group having 1 to 3 carbon atoms or a direct bond, $X^1$ and $X^2$ each independently represent an oxygen atom, a sulfur atom, or a sulfonamide.)

Specific examples of the fluorine compound having a hydroxyl group and represented by general formula (B) above include the following:

[Chem. 3]

B-1:
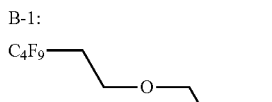

B-2:
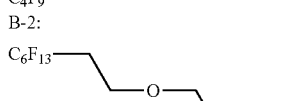

B-3:
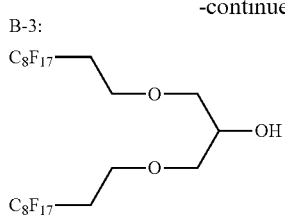

Specific examples of the fluorinated (meth)acrylate represented by general formula (AG-2) include the following:

[Chem. 4]

A-14:
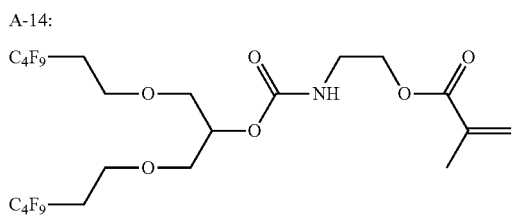

A-15:
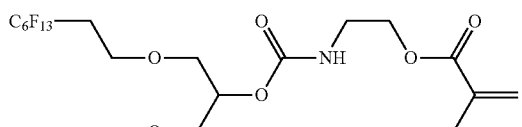

A-16:
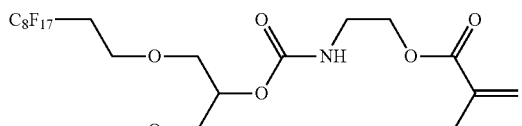

A-17:
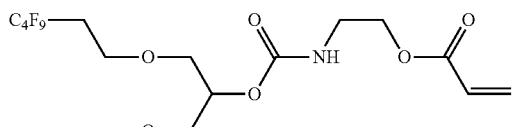

A-18:
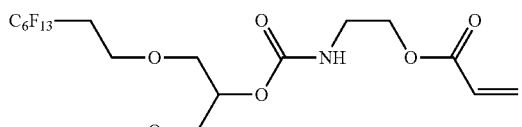

A-19:
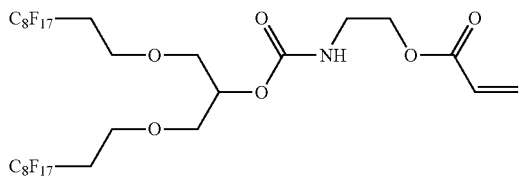

It should be noted that the present invention is not limited to these specific examples. These fluorinated (meth)acrylates may be used alone or in combination of two or more compounds. In consideration of the compatibility with other components etc., the fluorinated (meth)acrylic polymer is preferably a copolymer with a non-fluorine (meth)acrylate. Such a non-fluorine (meth)acrylate is not particularly limited. However, from the standpoint of the compatibility with other components etc., a macromonomer-type non-fluorine (meth)acrylate containing a polyoxyalkylene group is preferable.

Examples of commercially available compounds include NK Ester M-20G, M-40G, M-90G, M-230G, M-450G, AM-90G, 1G, 2G, 3G, 4G, 9G, 14G, 23G, 9PG, A-200, A-400, A-600, APG-400, and APG-700, all of which are manufactured by Shin-Nakamura Chemical Co., Ltd.; and BLEMMER PE-90, PE-200, PE-350, PME-100, PME-200, PME-400, PME-4000, PP-1000, PP-500, PP-800, 70FEP-350B, 55PET-800, 50POEP-800B, 10PB-500B, 10APB-500B, NKH-5050, PDE-50, PDE-100, PDE-150, PDE-200, PDE-400, PDE-600, AP-400, AE-350, ADE-200, and ADE-400, all of which are manufactured by NOF Corporation. It should be noted that the present invention is not limited to the above specific examples.

Alternatively, non-fluorine (meth)acrylates other than the above compounds may also be used. Examples of the exemplified compounds include styrene, butadiene, nucleus-substituted styrene, acrylonitrile, vinyl chloride, vinylidene chloride, vinyl pyridine, N-vinylpyrrolidone, vinylsulfonic acid, vinyl acetate, vinyl ethers such as butyl vinyl ether, cyclohexyl vinyl ether, and hydroxyl butyl vinyl ether, $\alpha,\beta$-ethylenically unsaturated carboxylic acids, namely, monovalent or divalent carboxylic acids such as acrylic acid, methacrylic acid, maleic acid, fumaric acid, and itaconic acid, $\alpha,\beta$-ethylenically unsaturated carboxylic acid derivatives, namely, alkyl (meth)acrylates (hereinafter, this notation collectively represents both alkyl acrylates and alkyl methacrylates) having an alkyl group having 1 to 18 carbon atoms, such as methyl, ethyl, propyl, butyl, octyl, 2-ethyhexyl, decyl, dodecyl, and stearyl esters of (meth)acrylic acid, hydroxyalkyl esters of (meth)acrylic acid, the hydroxyalkyl esters having 1 to 18 carbon atoms, such as 2-hydroxyethyl ester, hydroxypropyl ester, and hydroxybutyl ester thereof; mono(acryloyloxyethyl)acid phosphate, mono(methacryloxyethyl)acid phosphate, benzyl (meth)acrylate, and phenoxyethyl (meth)acrylate.

Examples thereof further include aminoalkyl esters of (meth)acrylic acid, the aminoalkyl esters having 1 to 18 carbon atoms, such as dimethylaminoethyl ester, diethylaminoethyl ester, and diethylaminopropyl ester thereof; ether oxygen-containing alkyl esters of (meth)acrylic acid, the ether oxygen-containing alkyl esters having 3 to 18 carbon atoms, such as methoxyethyl ester, ethoxyethyl ester, methoxypropyl ester, methylcarbyl ester, ethylcarbyl ester, and butylcarbyl ester thereof; cyclic structure-containing monomers such as dicyclopentanyloxylethyl (meth)acrylate, isobornyloxylethyl (meth)acrylate, isobornyl (meth)acrylate, adamantyl (meth)acrylate, dimethyladamantyl (meth)acrylate, dicyclopentanyl (meth)acrylate, and dicyclopentenyl (meth)acrylate; alkyl vinyl ethers having an alkyl carbon number of 1 to 18, such as methyl vinyl ether, propyl vinyl ether, and dodecyl vinyl ether; diglycidyl esters of (meth)acrylic acid, namely, glycidyl methacrylate and glycidyl acrylate; and commercially available products such as AA-6 and AN-6 manufactured by Toagosei Co., Ltd.; Silaplane FM-0711, FM-0721, and TM-0701T manufactured by Chisso Corporation; HOA-MS, HOA-MPL, HOA-MPE, and HOA-HH manufactured by Kyoeisha Chemical Co., Ltd.; and ARONIX M-5300, M-5400, M-5500, M-5600, and M-5700 manufactured by Toagosei Co., Ltd. It should be noted that the present invention is not limited to these specific examples.

These non-fluorinated (meth)acrylates may be used alone or in combination of two or more compounds.

The method for producing the fluorinated (meth)acrylic polymer used in the present invention is not particularly limited. The fluorinated (meth)acrylic polymer can be produced by a well-known method such as a solution polymerization method, a bulk polymerization method, or an emulsion polymerization method on the basis of a polymerization mechanism such as a radical polymerization method, a cationic polymerization method, or an anionic polymerization method. Among these, the radical polymerization method is industrially preferable because this method is simple.

In this case, polymerization initiators that are well known in this technical field can be used. Examples thereof include peroxides such as benzoyl peroxide and diacyl peroxide, azo compounds such as azobisisobutylonitrile and phenylazotriphenylmethane, and metal chelate compounds such as $Mn(acac)_3$. The molecular weight of the polymer can be controlled by, for example, the type of polymerization method or polymerization initiator used. If necessary, a chain transfer agent that is well known in this technical field may be used. Examples of the chain transfer agent include lauryl mercaptan, 2-mercaptoethanol, ethylthioglycolic acid, and octylthioglycolic acid.

Alternatively, it is also possible to obtain a fluorine-based random copolymer or block copolymer used in the present invention by photopolymerization in the presence of a photosensitizer or a photoinitiator, or polymerization using radiation or heat as an energy source.

The polymerization can be carried out in the presence or absence of a solvent. However, the polymerization in the presence of a solvent is preferable from the standpoint of workability. Examples of the solvent that can be used include ketones such as acetone, methyl ethyl ketone, and methyl isobutyl ketone; esters such as methyl acetate, ethyl acetate, and butyl acetate; polar solvents such as dimethylformamide and dimethyl sulfoxide; halogen-containing solvents such as 1,1,1-trichloroethane and chloroform; ethers such as tetrahydrofuran and dioxane; aromatic solvents such as benzene, toluene, and xylene; and fluorinated inert liquids such as perfluorooctane and perfluorotri-n-butylamine.

The molecular weight of the fluorinated (meth)acrylic polymer according to the present invention is preferably in the range of 3,000 to 1,000,000, and more preferably in the range of 5,000 to 500,000, and still more preferably in the range of 10,000 to 300,000 in terms of weight-average molecular weight.

The fluorine-based surfactants added may be used alone or as a mixture of two or more surfactants. In addition, a small amount of a silicone-based surfactant or a hydrocarbon-based surfactant may be mixed with the fluorine-based surfactant. Alternatively, such a surfactant component may be copolymerized in the molecules of the fluorine-based surfactant.

Furthermore, in addition to the fluorine-based surfactant, a fluorocarbon resin such as polyvinylidene fluoride, or a resin such as polystyrene, polycarbonate, or polymethylmethacrylate may further be added as required.

Examples of the fluorine-based surfactant include, but are not particularly limited to, MEGAFACE F-482, MEGAFACE F-470 (R-08), MEGAFACE F-472SF, MEGAFACE R-30, MEGAFACE F-484, MEGAFACE F-486, MEGAFACE F-172D, DEFENSA MCF-350SF, and MEGAFACE F-178RM (trade names, all of which are manufactured by DIC Corporation). These surfactants may be used alone or in combination of two or more surfactants. These fluorine-based surfactants are incorporated in an amount of 0.005% to 5.0% by mass, and preferably 0.05% to 1.0% by mass of the total ink composition in terms of active components.

The fluorine-based surfactant used in the organic semiconductor ink composition example is preferably a solid at room temperature, and the addition of such a surfactant is preferable. In particular, when a crystalline organic semiconductor such as P3HT, PQT, or PBTTT is used, by adding such a solid fluorine-based surfactant to the ink, it is possible not only to improve printing properties such as an inking property on a plate, a pattern-forming property, and a transfer property but also to expect an improvement in properties of a semiconductor film formed by drying the ink, for example, the electron field-effect mobility and the ON/OFF ratio. The reason for this is believed to be as follows: In the case where such a fluorine-based surfactant that is a solid at room temperature is used, in a dry thin film composed of an organic semiconductor ink, a phase separation clearly occurs between a layer composed of an organic semiconductor and a layer composed of the surfactant. Accordingly, the formation of the organization of the organic semiconductor is not inhibited, and the added solid fluorine-based surfactant accelerates the formation of the organization of the organic semiconductor. Of course, this does not limit the present invention.

The present invention relates to an organic semiconductor ink composition, and the type and the structure of an organic transistor to which the present invention can be applied are not limited. The present examples can be applied to the formation of various lateral transistors such as a bottom-contact transistor and a top-contact transistor, vertical transistors, and bipolar transistors such as CMOS. For example, a lateral transistor forming a TFT includes, as a basic structure, (a) a substrate, (b) a gate electrode, (c) an insulating layer, (d) a channel-forming region formed on an organic semiconductor layer that is in contact with the insulating layer, and (e) source/drain electrodes, all of which are provided on the substrate.

Examples of the substrate on which an organic transistor is formed include, but are not limited to, silicon, silicon having a thermally oxidized film, the surface of silicon being oxidized so as to function as an insulting layer, glass, a metal thin plate composed of stainless steel or the like, plastic films composed of polycarbonate (PC), polyethylene terephthalate (PET), polyimide (PI), polyethersulfone (PES), or polyethylene naphthalate (PEN), and composite films obtained by providing a gas barrier property or a hard coat layer on any of these films. In the case where a TFT is formed, these plastic films are preferably used from the standpoint of realization of a flexible transistor.

The method for forming respective functional layers except for an organic semiconductor layer composed of the organic semiconductor ink composition of the present invention is not particularly limited, and may be a dry process or a wet process. For example, for the formation of a gate electrode, a dry process such as sputtering, vapor deposition, ion plating, photolithography, or etching, or a wet process using a conductive ink can be applied. In particular, the wet process is a preferred embodiment of the present invention because a significant reduction in the production cost can be expected. As the wet process, an ink jet method, a screen printing method, a spin coating method, a bar coating method, a slit coating method, a dip coating method, a spray coating method, a gravure printing method, a flexographic printing method, a gravure offset method, a relief offset method, a microcontact printing method, a reverse printing method, or the like is employed.

The conductive ink used for forming a gate electrode by a printing method may contain, in an appropriate solvent, a conductive component, for example, particles of a metal such as gold, silver, copper, nickel, zinc, aluminum, calcium, magnesium, iron, platinum, palladium, tin, chromium, or lead; a conductive alloy of these metals, such as an alloy of silver and palladium; a thermally decomposable metal compound, such as silver oxide, an organosilver compound, or an organogold compound, which provides a conductive metal by being thermally decomposed at a relatively low temperature; or particles of a conductive metal oxide such as zinc oxide (ZnO) or indium tin oxide (ITO); or a conductive polymer such as polyethylenedioxythiophene/polystyrene sulfonate (PEDOT/PSS) or polyaniline. The type of solvent is not limited, and any solvent suitable for the dissolution or dispersion of the conductive materials can be appropriately selected. For example, water and various organic solvents such as hydrocarbon solvents, alcohol solvents, ketone solvents, ether solvents, ester solvents, glycol ether solvents, and fluorine-containing solvents can be used. Besides the above conductive materials, if necessary, the ink may contain a binder component such as a resin, an antioxidant, a catalyst for promoting film formation, an interfacial energy-adjusting agent, a leveling agent, a release accelerator, and the like. Among these, an ink obtained by dispersing silver nanoparticles in a solvent, and mixing a release agent such as low-molecular silicone and an interfacial energy-adjusting agent such as a fluorine-based surfactant can be preferably used because such an ink is suitable for a printing method and has an excellent patterning property and a high conductivity when being baked at a low temperature. The conversion from an ink film layer to a functional material layer constituting an electronic component can be carried out by a method optimum for respective ink properties and the electronic component, for example, drying at room temperature, heat treatment, or irradiation of ultraviolet light or an electron beam.

As described above, the method for forming an insulating layer of an organic transistor formed using the organic semiconductor ink composition of the present invention is not limited. For example, a dry process such as sputtering, vapor deposition, ion plating, photolithography, or etching or a wet process such as a printing method can be applied. In particular, the wet process is a preferred embodiment because a significant reduction in the production cost can be expected. As the wet process, an ink jet method, a screen printing method, a spin coating method, a bar coating method, a slit coating method, a dip coating method, a spray coating method, a gravure printing method, a flexographic printing method, a gravure offset method, a relief offset method, a reverse printing method, or the like is employed.

In the case where a printing method is applied, the insulating ink forming the insulating layer should contain a material that exhibits an insulating property. Examples of the material that can be used include epoxy resins, polyimide resins, polyvinyl pyrrolidone resins, polyvinyl alcohol resins, acrylonitrile resins, methacrylic resins, polyamide resins, polyvinyl phenol resins, phenolic resins, polyamide-imide resins, fluorocarbon resins, melamine resins, urethane resins, polyester resins, and alkyd resins. These resins may be used alone or in combination of two or more resins. In addition, high-relative-dielectric-constant particles such as alumina fine particles, zirconia fine particles, silica fine particles, or tantalum oxide fine particles, or low-relative-dielectric-constant particles such as hollow silica fine particles may be optionally added as an extender component. The solvent that can be applied to the insulating ink is not limited. For example, water and various organic solvents such as hydrocarbon solvents, alcohol solvents, ketone solvents, ether solvents, ester solvents, glycol ether solvents, and fluorine-containing solvents can be used. In addition, if necessary, an antioxidant, a leveling agent, a release accelerator, and various catalysts for promoting film formation may be used. Furthermore, a silicone-based surfactant and a fluorine-based surfactant may be added. The conversion from an ink film layer to a functional material layer constituting a transistor can be carried out by a method optimum for respective ink properties and the electronic component, for example, drying at room temperature, heat treatment, or irradiation of ultraviolet light or an electron beam.

In an organic transistor that can be formed using the organic semiconductor ink composition of the present invention, the formation of source and drain electrodes is also not particularly limited, and a dry process or a wet process may be employed. As in the formation of the gate electrode, a dry process such as sputtering, vapor deposition, ion plating, photolithography, or etching, or a wet process such as a printing method can be applied. In particular, the wet process is a preferred embodiment because a significant reduction in the production cost can be expected. As the wet process, an ink jet method, a screen printing method, a spin coating method, a bar coating method, a slit coating method, a dip coating method, a spray coating method, a gravure printing method, a flexographic printing method, a gravure offset method, a relief offset method, a microcontact printing method, a relief reverse printing method, or the like is employed.

In the case of a printing method, the same ink as that used for forming the gate electrode can be used as a conductive ink that forms the source and drain electrodes. In particular, an ink obtained by dispersing silver nanoparticles in a solvent, and mixing a release agent such as low-molecular silicone and an interfacial energy-adjusting agent such as a fluorine-based surfactant can be suitably used because such an ink is suitable for a reverse printing method or a microcontact printing method and has an excellent patterning property and a high conductivity when being baked at a low temperature. The conversion from an ink film layer to the source and drain electrodes constituting an organic transistor can be carried out by a method optimum for respective ink properties and the electronic component, for example, drying at room temperature, heat treatment, or irradiation of ultraviolet light or an electron beam.

The organic semiconductor ink composition of the present invention is applicable to a method that is a so-called wet process, such as an ink jet method, a screen printing method, a spin coating method, a bar coating method, a slit coating method, a dip coating method, a spray coating method, a gravure printing method, a flexographic printing method, a gravure offset method, or a relief offset method. However, in particular, by applying the organic semiconductor ink composition to a microcontact printing method or a reverse printing method, an organic transistor having a performance higher than that obtained to date can be formed with a high efficiency at a low cost. The ink jet method, the flexographic printing method, the gravure printing method, and the like are disadvantageous in terms of pattern precision because, basically, a pattern is formed on a substrate by transfer in a wet state. In contrast to these printing methods, in the microcontact printing method and the reverse printing method, a very precise organic semiconductor pattern can be formed because an organic semiconductor layer pattern is accurately and precisely formed on a liquid-repellent transfer substrate, and the pattern is transferred to a substrate in a dry state or a semi-dry state in which the shape of the pattern is maintained. Furthermore, different types of organic semiconductor materials or different shapes can be easily and accurately formed at any position on the same substrate. According to the present invention, not only a unipolar transistor such as a TFT but also, for example, an organic CMOS circuit including an N-type organic semiconductor and a P-type organic semiconductor can be easily formed by a printing method.

FIG. 1 illustrates a concept of steps of a typical microcontact printing method that utilizes a relief plate transfer. First, a transfer plate having a relief plate functioning as an organic semiconductor pattern is prepared. The plate is prepared as follows. A master plate having a negative pattern is formed by a photolithography-etching method or the like using silicone, glass, or the like. An appropriate mold release treatment is performed, and polydimethyl siloxane (PDMS) is poured into the master plate and cured to make a mold. Thus, a projecting pattern plate composed of PDMS (silicone rubber) is obtained. Subsequently, inking is performed on the prepared silicone rubber plate using a spin coater, a bar coater, a slit coater, or the like. After the ink is moderately dried, the silicone rubber plate is lightly pressed on a substrate to transfer an ink pattern formed on a projecting portion of the plate to obtain a desired pattern.

For example, in the case where a bottom-contact TFT is formed, the organic semiconductor ink on the relief plate is positioned so as to extend over source and drain electrodes that have been previously formed, and is lightly pressed to perform transfer.

FIG. 2 illustrates a concept of steps of a reverse printing method. A uniform organic semiconductor ink-applied surface is obtained on a smooth surface of a silicone rubber or fluorine rubber functioning as a liquid-repellent transfer surface of a blanket using a spin coater, a bar coater, a slit coater, or the like. Subsequently, after the ink is moderately dried, a relief plate having a negative pattern of an organic semiconductor pattern is pressed on the ink-applied surface to remove an unnecessary portion from the blanket. Subsequently, a pattern remaining on the blanket is lightly pressed on a substrate to perform a pattern transfer. For example, in the case where a bottom-contact TFT is formed, positioning is performed so that the organic semiconductor pattern extends over source and drain electrodes that have been previously formed, and transfer is performed.

EXAMPLES

Synthesis Example 1

Synthesis of Fluorinated (Meth)Acrylic Polymer (1)

Twenty seven parts by weight of (A-1) serving as a fluorinated (meth)acrylate, 21.6 parts by weight of polyoxypropylene monomethacrylate (average degree of polymerization; 5) and 5.4 parts by weight of 3-methacryloxypropyltris(trimethylsiloxy)silane serving as non-fluorine (meth)acrylates, 66.1 parts by weight of methyl ethyl ketone (MEK) serving as a polymerization solvent, and 0.54 parts by weight of dimethyl-2,2'-azobis(2-methylpropionate) serving as a polymerization initiator were weighed and charged in a glass flask equipped with a stirrer, a condenser, a thermometer, and a dropping funnel. In addition, a solution (dropping solution) was separately prepared in advance by mixing 63 parts by weight of (A-1), 50.4 parts by weight of polyoxypropylene monomethacrylate (average degree of polymerization; 5), 12.6 parts by weight of 3-methacryloxypropyltris(trimethylsiloxy)silane, 124.2 parts by weight of MEK, and 1.26 parts by weight of dimethyl-2,2'-azobis(2-methylpropionate). A nitrogen stream was supplied to the glass flask, and the temperature was increased to 80° C. The dropping solution was then added dropwise over a period of two hours, and the resulting solution was held at 80° C. for three hours. Subsequently, a solution prepared by dissolving 0.9 parts by weight of dimethyl-2,2'-azobis(2-methylpropionate) in 9 parts by weight of MEK was added thereto, and the resulting solution was further held for seven hours to obtain a fluorinated (meth)acrylic polymer (1). The prepared polymer (1) had a weight-average molecular weight Mw of 185,000 in terms of polystyrene measured by gel permeation chromatography (GPC).

Synthesis Example 2

Synthesis of Fluorinated (Meth)Acrylic Polymer (2)

First, 9.3 g of (A-1) serving as a fluorinated (meth)acrylate, 18 g of 4-(6-acryloyloxyhexyloxy)phenylbenzene serving as a non-fluorine (meth)acrylate, 220 mL of toluene serving as a polymerization solvent, and 2,2'-azobis(2,4-dimethylvaleronitrile) serving as a polymerization initiator, and 0.55 g of (A-1) were weighed and charged in a glass polymerization tube. A nitrogen stream was supplied to this solution to remove oxygen, and the solution was then allowed to react at 60° C. for 24 hours. After the completion of the reaction, the reaction solution was concentrated, and the concentrated solution was added dropwise to 1 L of methanol. The precipitated solid was sufficiently washed with methanol to obtain a fluorinated (meth)acrylic polymer (2). The prepared polymer (2) had a weight-average molecular weight Mw of 47,000 in terms of polystyrene measured by GPC.

Synthesis Example 3

Synthesis of Fluorinated (Meth)Acrylic Polymer (3)

To a four-necked glass flask equipped with a stirrer, a condenser, and a thermometer, 19.6 parts by mass of MIBK, 5.0 parts by mass of the double-chain fluorinated monomer represented by A-15, 1.4 parts by mass of α-butyl-ω-(3-methacryloxypropyl)polydimethylsiloxane having an average molecular weight of 5,000, 1.4 parts by mass of a monoacrylate having, in a side chain thereof, a copolymer of ethylene oxide and propylene oxide with an average molecular weight of 2,200, 5.0 parts by mass of methyl methacrylate, 2.8 parts by mass of 2-hydroxyethyl methacrylate, 6.1 parts by mass of isobornyl methacrylate, and 2.2 parts by mass of t-butylperoxy-2-ethylhexanoate were charged, and the temperature was increased to 80° C. under stirring. A mixture of 70.5 parts by mass of MIBK, 18.0 parts by mass of the double-chain fluorinated monomer represented by A-15, 5.1 parts by mass of α-butyl-ω-(3-methacryloxypropyl)polydimethylsiloxane having an average molecular weight of 5,000, 5.1 parts by mass of the monoacrylate having, in a side chain thereof, a copolymer of ethylene oxide and propylene oxide with an average molecular weight of 2,200, 18.0 parts by mass of methyl methacrylate, 10.2 parts by mass of 2-hydroxyethyl methacrylate, 21.9 parts by mass of isobornyl methacrylate, and 7.8 parts by mass of t-butylperoxy-2-ethylhexanoate was added dropwise thereto over a period of three hours. After the completion of the dropwise addition, the resulting mixture was allowed to react at 80° C. for two hours, and then allowed to react at 110° C. for nine hours. After the reaction, the solvent was removed at 80° C. with an evaporator, and drying was then conducted with a hot-air dryer to obtain a fluorinated (meth)acrylic polymer (3) having a solid content of 98% or more. This copolymer had a weight-average molecular weight Mw of 26,400 in terms of polystyrene measured by GPC.

(Methods for Evaluating Patterning Property of Organic Semiconductor Ink)
(Methods for Evaluating Printing Properties)

A pattern-forming property of an organic semiconductor was evaluated by the following methods.

(1) Inking

An organic semiconductor ink was evenly applied onto a surface of a silicone rubber blanket with a bar coater.

(2) Pattern Formation

A glass relief plate having a negative pattern that forms a grid pattern having a line width of 10 μm and a pattern distance of about 50 μm was lightly pressed on the ink-applied surface to remove an unnecessary portion of the ink from the silicone rubber surface.

(3) Pattern Transfer

The grid pattern having a line width of 10 μm and formed on the silicone rubber surface was lightly pressed on a polycarbonate film with a hard coating, thus transferring the grid pattern. A pattern transfer property was evaluated by observing the shape with a digital microscope and an optical interference profilometer.

(Fabrication of Element for Measurement of Organic Transistor Characteristics)

Figure 3:
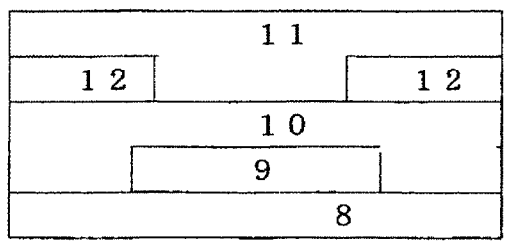
FIG. 3 is a schematic structural view of an organic semiconductor element including a layer composed of an organic semiconductor ink composition.

An element for a measurement of characteristics of a transistor having a bottom-gate, bottom-contact (BGBC) structure illustrated in FIG. 3 was fabricated by the following procedure.

(1. Formation of Gate Electrode)

A conductive ink in which silver nanoparticles are uniformly dispersed was evenly applied onto a surface of a silicone rubber blanket with a bar coater and was moderately dried. A quartz glass relief plate having a negative pattern of a gate electrode pattern was pressed on the surface onto which the silver nanoparticle ink was evenly applied. Thus, an unnecessary portion of the ink was removed. The pattern remaining on the blanket was lightly pressed on a polycarbonate film (PC film) with a hard coating, the PC film being cut to have a certain size, thus transferring the gate pattern to the PC film. Subsequently, the PC film was baked in an oven at 175° C. for 30 minutes to form the gate electrode pattern on the PC film.

(2. Formation of Insulating Layer)

An insulating ink containing, as an insulating resin component, an equivalent mixture of a bisphenol-type epoxy and a copolymer of polyvinyl phenol and a polymethacrylate was applied by a spin-coating method onto the gate electrode formed in (1) above. Subsequently, heat treatment was performed in a clean oven at 160° C. for one hour to form a gate insulating layer having a thickness of about 1 μm.

(3. Formation of Source and Drain Electrodes)

A thin film composed of a conductive ink in which silver nanoparticles were uniformly dispersed was evenly formed with a slit coater on a transparent blanket including a PEN film and a silicone rubber layer formed on the PEN film. The thin film was moderately dried. Subsequently, a quartz glass relief plate having a negative pattern of source/drain electrodes with a channel length of 5 μm and a channel width of 500 μm was pressed on the surface onto which the silver nanoparticle ink was evenly applied. Thus, an unnecessary portion of the ink was removed. The positions were adjusted with an aligner so that the gate electrode pattern that was previously formed and the source/drain electrode pattern overlap each other in the vertical direction, and the blanket was pressed. Thus, the source/drain electrode pattern was transferred to the substrate so as to overlap on the gate electrode pattern with the insulating film therebetween. Subsequently, baking was performed at 175° C. for 30 minutes to fabricate a bottom-gate substrate in which the gate electrode having a thickness of about 100 nm, the organic insulating film having a thickness of about 1 and the source/drain electrodes having a thickness of about 150 nm were formed on the PC film.

(4. Formation of Organic Semiconductor Layer)

A uniform thin film composed of a semiconductor ink was formed on a transparent blanket including PEN as a base material by the same method as (3) above using organic semiconductor ink compositions (Example 1 ink to Example 5 ink) described below. A quartz glass relief plate having a negative pattern of a semiconductor pattern was pressed on the surface to which the semiconductor ink was evenly applied. Thus, an unnecessary portion of the ink was removed. The organic semiconductor pattern was transferred to the substrate with an aligner so as to extend over the source/drain electrodes by the same method as (3) above. Thus, a bottom-gate, bottom-contact organic transistor element having a channel length of 5 μm and a channel width of 500 μm was fabricated.

(Method for Evaluating Transistor Characteristics)

The element fabricated in (1. to 4.) above was heat-treated in a glove box at 150° C. for about 5 minutes. Semiconductor characteristics of the element were then measured under a light-shielded condition in the glove box using a semiconductor parameter analyzer (4200, manufactured by Keithley Instruments Inc.). Thus, the electron field-effect mobility (drain current=−40V), the drain current maximum/minimum (ON/OFF ratio), the threshold voltage (Vth), and the sub-threshold swing (S value) were determined by known methods. Table 1 shows the results.

Preparation of Example 1 Ink

In a mixed solvent containing 4 g of chloroform, 3 g of tetralin, and 3 g of tetrafluoromethylbenzene, 0.02 g of P3HT (Mw=about 30,000) manufactured by Merck KGaA was dissolved under heating, and, as a fluorine-based surfactant, 0.005 g of the fluorinated (meth)acrylic polymer (1) obtained in Synthesis Example 1 was added thereto. Thus, a clear orange organic semiconductor ink composition (Example 1 ink) was prepared. The printing properties of the ink were evaluated by the methods for evaluating ink printing properties described above. It was confirmed that a grid pattern having a thickness of about 40 nm and a line width of 10 μm could be formed without defects. Furthermore, an element for the measurement of transistor characteristics was fabricated using Example 1 ink by the above-described method for forming an organic transistor by printing, and the transistor characteristics of the element were measured. Table 1 shows the results.

Preparation of Example 2 Ink

In 4 g of chloroform, 3 g of mesitylene, and 2 g of ortho-dichlorobenzene, 0.04 g of P3HT (Mw=about 110,000) manufactured by Merck KGaA was dissolved under heating, and, as a fluorine-based surfactant, 0.2 g of a 10 wt % mesitylene solution of the fluorinated (meth)acrylic polymer (2) obtained in Synthesis Example 2 was added thereto. Thus, a clear orange organic semiconductor ink composition (Example 2 ink) was prepared. The printing properties of the ink were evaluated by the methods for evaluating ink printing properties described above. It was confirmed that a grid pattern having a thickness of about 40 nm and a line width of 10 μm could be formed without defects. Furthermore, an element for the measurement of transistor characteristics was fabricated using Example 2 ink by the above-described method for forming an organic transistor by printing, and the transistor characteristics of the element were measured. Table 1 shows the results.

Preparation of Example 3 Ink

In 6 g of chloroform and 4 g of mesitylene, 0.04 g of P3HT (Mw=about 50,000) manufactured by Merck KGaA was dissolved under heating to obtain a clear orange solution. This solution was then slowly cooled to prepare an agar-like reddish-brown P3HT gel. Subsequently, 2 g of dichlorobenzotrifluoride, 4 g of ortho-dichlorobenzene, and 0.16 g of a 10 wt % mesitylene solution of the solid fluorine-based surfactant obtained in Synthesis Example 2 were added to 10 g of the above gel. The resulting mixture was lightly shaken to break the gel and filtered with a filter having a pore diameter of 0.45 μm. Thus, a reddish-brown, liquid, P3HT gel-dispersed ink (Example 3 ink) was obtained. The printing properties of the ink were evaluated by the methods for evaluating ink printing properties described above. It was confirmed that a grid pattern having a thickness of about 40 nm and a line width of 10 μm could be formed without defects. Furthermore, an element for the measurement of transistor characteristics was fabricated using Example 3 ink by the above-described method for forming an organic transistor by printing, and the transistor characteristics of the element were measured. Table 1 shows the results.

Preparation of Example 4 Ink

A P3HT ink (Example 4 ink) having substantially the same formulation as Example 2 ink was prepared as in Example 2 ink except that the fluorine-based surfactant was changed to the solid fluorinated (meth)acrylic polymer (3) obtained in Synthesis Example 3. The printing properties of the ink were evaluated by the methods for evaluating ink printing properties described above. It was confirmed that a grid pattern having a thickness of about 40 nm and a line width of 10 μm could be formed without defects. Furthermore, an element for the measurement of transistor characteristics was fabricated using Example 4 ink by the above-described method for forming an organic transistor, and the transistor characteristics of the element were measured. Table 1 shows the results.

Preparation of Example 5 Ink

In a mixed solvent of 3 g of chloroform and 7 g of anisole, 0.02 g of P3HT (Mw: about 35,000) manufactured by Merck KGaA and 0.02 g of PQT12 (Mw=33,000) manufactured by American Dye Source, Inc. were dissolved under heating. This solution was then slowly cooled to prepare an agar-like reddish-brown P3HT/PQT12 mixed gel. Subsequently, 2.5 g of tetralin, 2.5 g of trifluoromethyl benzene, and 0.03 g of MCF350SF (solid fluorine-based surfactant manufactured by DIC Corporation) were added to 10 g of the above gel. The resulting mixture was lightly shaken to break the gel and filtered with a filter having a pore diameter of 0.45 μm. Thus, a reddish-brown, liquid, P3HT/PQT12 mixed gel-dispersed ink (Example 5 ink) was obtained. The printing properties of the ink were evaluated by the methods for evaluating ink printing properties described above. It was confirmed that a grid pattern having a thickness of about 40 nm and a line width of 10 μm could be formed without defects. Furthermore, an element for the measurement of transistor characteristics was fabricated using Example 5 ink by the above-described method for forming an organic transistor by a printing method, and the transistor characteristics of the element were measured. Table 1 shows the results.

Preparation of Comparative Example 1 Ink

In 10 g of chloroform, 0.03 g of P3HT (Mw: about 35,000) manufactured by Merck KGaA was dissolved under heating to obtain a clear orange solution (Comparative Example 1 ink). A thin film was formed on a silicone rubber blanket for transfer with a bar coater using the prepared solution. The thin film strongly and closely adhered to the silicone rubber. When a glass relief plate functioning as a removal plate for a reverse printing method was pressed on the thin film, it was impossible to remove an unnecessary portion of the pattern with the glass plate.

Preparation of Comparative Example 2 Ink

In 10 g of xylene, 0.03 g of P3HT (Mw: about 35,000) manufactured by Merck KGaA was dissolved under heating to obtain a clear orange solution (Comparative Example 2 ink). A thin film was tried to be formed on a silicone rubber blanket for transfer with a bar coater using the prepared solution. However, the solution was repelled on the silicone rubber, and a uniform ink thin film could not be formed.

Preparation of Comparative Example 3 Ink

In 4 g of chloroform, 3 g of mesitylene, and 2 g of ortho-dichlorobenzene, 0.04 g of P3HT (Mw=about 110,000) manufactured by Merck KGaA was dissolved under heating to obtain a clear orange ink (Comparative Example 3 ink) in which P3HT was completely dissolved. The ink was stored in a refrigerator for a whole day and night to form a weak gel. The resulting gel was lightly shaken to break the gel and filtered with a filter including polypropylene medium having a pore diameter of 0.45 μm. Thus, a reddish-brown, opaque, gel dispersion (Comparative Example 3 ink) was obtained. A thin film was formed on a silicone rubber blanket for transfer with a bar coater using the prepared dispersion. Adhesiveness of the thin film to the silicone rubber was relatively high. When a glass relief plate functioning as a removal plate for a reverse printing method was pressed on the thin film, it was impossible to completely remove an unnecessary portion of the pattern with the glass plate, and failure of the pattern removal occurred in many portions. Furthermore, a pattern that could be partly formed on the blanket had a poor transfer property, and an organic semiconductor layer extending over the source electrode and the gate electrode without defects could not be formed.

TABLE 1

| | Mobility [cm$^2$/Vs] | ON/OFF | Vth [V] | S value |
|---|---|---|---|---|
| Example 1 | 0.0022 | $1.2 \times 10^8$ | 21.5 | 2.38 |
| Example 2 | 0.0062 | $4.6 \times 10^8$ | 18.7 | 2.11 |
| Example 3 | 0.0187 | $1.4 \times 10^9$ | 4.2 | 0.91 |
| Example 4 | 0.0164 | $9.4 \times 10^8$ | 5.1 | 1.05 |
| Example 5 | 0.0045 | $9.1 \times 10^7$ | 15.3 | 1.82 |

An organic semiconductor element formed using the organic semiconductor ink composition of the present invention can be suitably applied to the production of electronic elements used in a liquid crystal display, electronic paper, an EL display device, an RF-ID tag, a smart card, a memory, and the like.

The invention claimed is:

1. An organic semiconductor ink composition comprising:
an organic semiconductor;
an organic solvent; and
a fluorine-based surfactant,
wherein the ink composition is suitable for transferring an ink layer, formed by using the ink on a liquid-repellent transfer substrate, to a printing base material to obtain a desired ink pattern.

2. The organic semiconductor ink composition according to claim 1, wherein the organic semiconductor is present in a dispersed state in the organic semiconductor ink composition.

3. The organic semiconductor ink composition according to claim 1, wherein the organic semiconductor is a thiophene polymer compound.

4. The organic semiconductor ink composition according to claim 1, wherein the fluorine-based surfactant is a compound that is a solid at room temperature.

5. The organic semiconductor ink composition according to claim 1, wherein the organic solvent is a mixed organic solvent containing at least one solvent having a boiling point of 100° C. or lower and at least one solvent having a boiling point of 150° C. or higher, and the mixed organic solvent has a surface tension of 35 mN/m or less.

6. A method for forming an organic semiconductor pattern of an organic transistor, the method comprising a step of forming an organic semiconductor pattern layer by a microcontact printing method and/or a reverse printing method using the organic semiconductor ink composition according to claim 1.

* * * * *